(12) United States Patent
Takeguchi

(10) Patent No.: US 9,281,384 B2
(45) Date of Patent: Mar. 8, 2016

(54) ULTRAVIOLET BLOCKING STRUCTURE AND METHOD FOR SEMICONDUCTOR DEVICE

(75) Inventor: Naoki Takeguchi, Fukushima-Ken (JP)

(73) Assignee: Cypress Semiconductor Corporation, San Jose, CA (US)

( * ) Notice: Subject to any disclaimer, the term of this patent is extended or adjusted under 35 U.S.C. 154(b) by 1359 days.

(21) Appl. No.: 12/133,689

(22) Filed: Jun. 5, 2008

(65) Prior Publication Data

US 2009/0174041 A1 Jul. 9, 2009

(30) Foreign Application Priority Data

Jun. 5, 2007 (JP) ................................. 2007-149794

(51) Int. Cl.
*H01L 29/66* (2006.01)
*H01L 21/02* (2006.01)
*H01L 21/768* (2006.01)
*H01L 29/792* (2006.01)

(52) U.S. Cl.
CPC .... *H01L 29/66833* (2013.01); *H01L 21/02532* (2013.01); *H01L 21/02664* (2013.01); *H01L 21/76832* (2013.01); *H01L 29/792* (2013.01); *H01L 29/66825* (2013.01); *H01L 2924/0002* (2013.01)

(58) Field of Classification Search
CPC .................. H01L 21/02532; H01L 21/02664; H01L 21/76832
USPC .......................................................... 257/659
See application file for complete search history.

(56) References Cited

U.S. PATENT DOCUMENTS

| | | | |
|---|---|---|---|
| 6,881,619 B1* | 4/2005 | Lee et al. ...................... | 438/216 |
| 7,018,896 B2* | 3/2006 | Ngo et al. ..................... | 438/261 |
| 2003/0032224 A1* | 2/2003 | Sung et al. .................... | 438/197 |
| 2006/0145303 A1* | 7/2006 | Wu et al. ....................... | 257/632 |

OTHER PUBLICATIONS

M. Bedjaoui, B. Despax, M. Caumont, C. Bonafos, Si nanocrystal-containing SiOx (x < 2) produced by thermal annealing of PECVD realized thin films, Materials Science and Engineering: B, vols. 124-125, EMRS 2005, Symposium D—Materials Science and Device Issues for Future Technologies, Dec. 5, 2005, pp. 508-512, ISSN 0921-5107.*

* cited by examiner

Primary Examiner — Mark Tornow

(57) ABSTRACT

Structures and methods for blocking ultraviolet rays during a film depositing process for semiconductor device are disclosed. In one embodiment, a semiconductor device includes an oxide-nitride-oxide (ONO) film formed on a semiconductor substrate, a gate electrode formed on the ONO film, a lower layer insulation film formed on the ONO film and the gate electrode, and a ultraviolet (UV) blocking layer based on a plurality of granular particles scattered in at least one insulation film formed on lower layer insulation film, where the UV blocking layer suppresses UV rays generated during an additional film deposition from reaching the ONO film.

18 Claims, 10 Drawing Sheets

ULTRAVIOLET BLOCKING STRUCTURE AND METHOD FOR SEMICONDUCTOR DEVICE

CLAIM OF PRIORITY

This application claims priority from Japanese patent application 2007-149794 filed on Jun. 5, 2007.

FIELD OF TECHNOLOGY

The present invention relates to semiconductor devices and methods, especially for a UV absorbing and/or blocking film.

BACKGROUND

During the manufacturing process of a semiconductor device, a film deposition is performed using a plasma chemical vapor deposition (plasma CVD) method, and an etching is performed using a reaction ion etching (RIE) method. Both of the aforementioned plasma CVD method and the RIE method employ plasma. In the course of the plasma treatments, ultraviolet (UV) rays may be generated, and damage an insulation film which contains silicon oxide or silicon nitride. The damage has become more problematic as the insulation film is ever getting thinner with the miniaturization of the semiconductor device.

Japanese Patent Application Publication No. 2003-243545 discloses a semiconductor device capable of suppressing the damage by the UV rays (related art 1). FIG. 1 is a cross sectional view of the related art 1 showing an ONO film 18 formed by depositing a tunnel oxide film 12, a charge storage layer 14 and a top oxide film 16 on a semiconductor substrate 10. A gate electrode 20 is formed on the ONO film 18. Bit lines 22 are formed in the semiconductor substrate 10 to have the respective adjacent side edges below the gate electrode 20. Side wall layers 24 are formed on both side surfaces of the gate electrode 20. A lower insulation film 26 is formed on the ONO film 18 to cover the gate electrode 20. A UV absorbing layer 28 and an upper insulation film 30 are formed on the lower insulation film 26. Plug metals 32 are formed above the bit lines 22 by piercing the ONO film 18, the lower insulation film 26, the UV absorbing layer 28, and the upper insulation film 30. Another plug metal 32 is formed above the gate electrode 20 by piercing the lower insulation film 26, the UV absorbing layer 28, and the upper insulation film 30.

In related art 1, through holes are formed above the bit lines 22 and the gate electrode 20 to form the plug metals 32. Each through hole pierces the UV absorbing layer 28 and the upper insulation film 30. Since the UV absorbing layer 28 is formed above the ONO film 18, the UV rays during the etching process may be absorbed by the UV absorbing layer 28. Accordingly, the amount of the UV rays which reach the ONO film 18 is reduced, thus suppressing the UV ray damage to the ONO film 18. Japanese Patent Application Publication No. 2005-347589 also discloses a technique for preventing the ONO film 18 from being damaged by the UV rays, where the UV absorbing layer 28 also serves as a wiring.

In the related arts, the UV absorbing layer 28 is generally formed of metal. As the semiconductor or the insulation films of the semiconductor device have a large number of dangling bonds, a leak current may be generated and flows between the plug metals 32 via the UV absorbing layer 28. A technique for suppressing the generation of the leak current is described in FIG. 2. In FIG. 2, a gap D is provided between the plug metals 32 and the UV absorbing layer 28. The gap D separates the plug metals 32 and the UV absorbing layer 28. Other components of the semiconductor device in the related arts are the same as that of the related arts shown in FIG. 1, so their description is omitted. In FIG. 2, the upper insulation film 30 with the gap D electrically separates the individual plug metals 32 to suppress the leak current from flowing between the plug metals 32. However, as the semiconductor device is miniaturized, so is the interval between the plug metals 32 as well as the gaps between the plug metals 32 and the UV absorbing layer 28. Thus, the leak current may still flow through the UV absorbing layer 28 and electrically conduct the plug metals 32, thus making the operation of the semiconductor device prone to a failure.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

One embodiment of the present invention is directed to a semiconductor device comprising an oxide-nitride-oxide (ONO) film formed on a semiconductor substrate, a gate electrode formed on the ONO film, a lower layer insulation film formed on the ONO film and the gate electrode, and a ultraviolet (UV) blocking layer based on a plurality of granular particles scattered in at least one insulation film formed on lower layer insulation film, where the UV blocking layer suppresses UV rays generated during an additional film deposition from reaching the ONO film.

As illustrated in the detailed description, other embodiments pertain to structures and methods that prevent the UV rays from damaging the ONO film during a subsequent film deposition. The protection is achieved by forming the UV blocking layer based on the granular particles which block and/or absorb the UV rays on their way to the ONO film. In addition, a leakage current generated in the semiconductor device can be prevented from flowing via the UV blocking layer as scattered positions of the granular particles in the insulation film prevent the leakage current from flowing through the UV blocking layer.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, embodiments pertain to structures and methods that prevent UV rays from damaging the ONO film of a flash memory device during a subsequent film deposition. The protection is achieved by forming a UV blocking layer based on granular particles which block and/or absorb the UV rays on their way to the ONO film. In addition, a leakage current generated in the flash memory device can be prevented from flowing via the UV blocking layer as scattered positions of the granular particles in one or more insulation films prevent the leakage current from flowing through the UV blocking layer.

The embodiment will be described which allows suppression of the damage by UV rays while miniaturizing the structure so as to solve the aforementioned disadvantage.

First Embodiment

Figure 1:
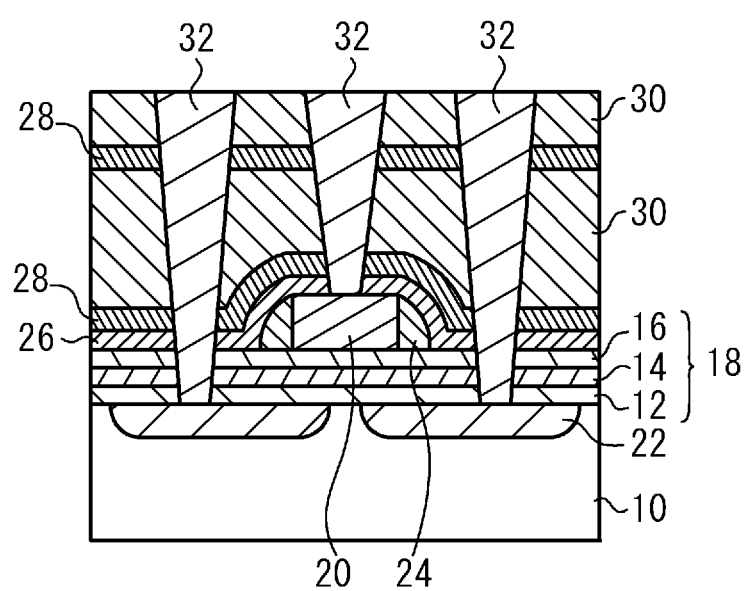
FIG. 1 is a cross sectional view of a conventional flash memory.
Figure 2:
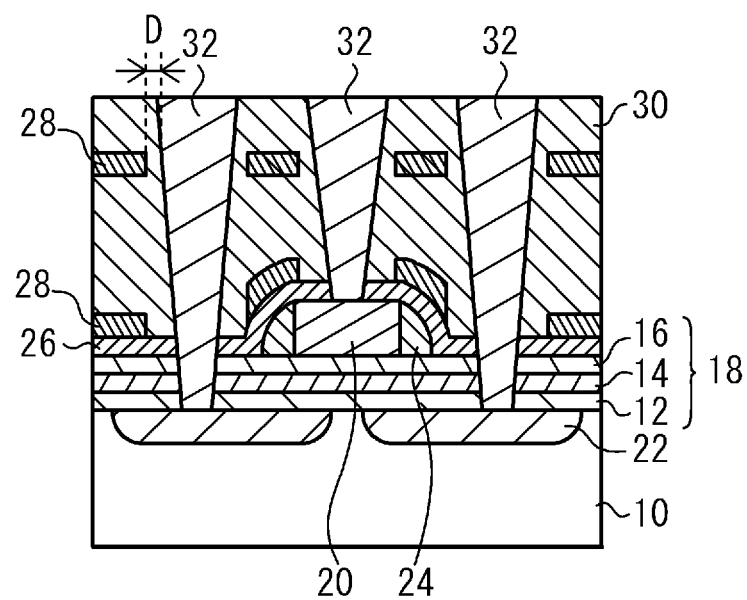
FIG. 2 is a cross sectional view illustrating a conventional technique to suppress a leakage current using a UV blocking layer.
Figure 3:
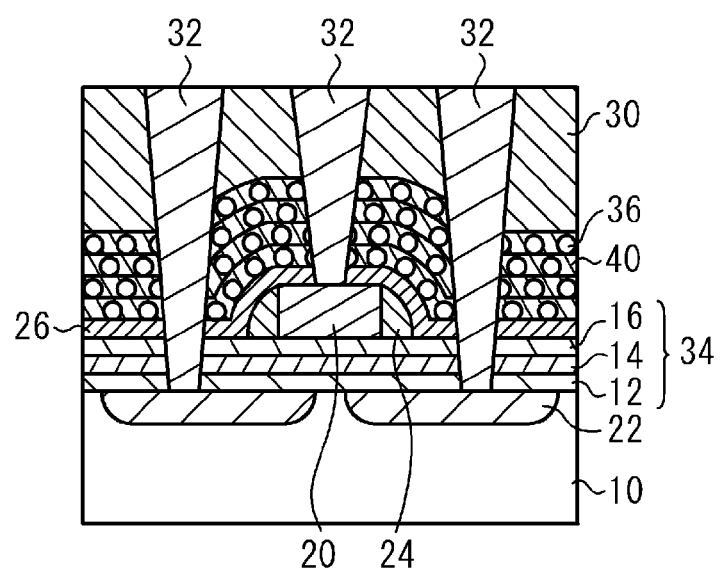
FIG. 3 is a cross sectional view of an exemplary flash memory, according to a first embodiment.

FIG. 3 is a cross sectional view of an exemplary flash memory, according to a first embodiment. In FIG. 3, a second insulation film 34 formed of an ONO film is produced by sequentially layering a tunnel oxide film 12, a charge storage layer 14 and a top oxide film 16 on a surface of a semiconductor substrate 10. A gate electrode 20 is formed on the second insulation film 34. Bit lines 22 are formed in the semiconductor substrate 10 to have respective adjacent side edges below the gate electrode 20. Side wall layers 24 are formed on both side surfaces of the gate electrode 20. A lower layer insulation film 26 is formed on the second insulation film 34 to cover the gate electrode 20.

A UV blocking layer or four layers of first insulation films 40 are layered on the lower layer insulation film 26. Each layer of the insulation films 40 is about 10 nm thick and contains granular particles such as silicon particles 36, with each particle measured 1 to 10 nm in diameter. The silicon particles 36 are dispersed in the first insulation film 40 so as not to be in contact with one another. An upper layer insulation film 30 is formed on the surface of the fourth first insulation film 40. Plug metals 32 are formed above the bit lines 22 by piercing through the second insulation film 34, the lower layer insulation film 26, the first insulation films 40 and the upper layer insulation film 30. Another plug metal 32 is also formed above the gate electrode 20 by piercing the lower layer insulation film 26, the first insulation films 40 and the upper layer insulation film 30, thus electrically coupling the gate electrode 20 and the bit line 22 to an external contact.

Figure 4A:
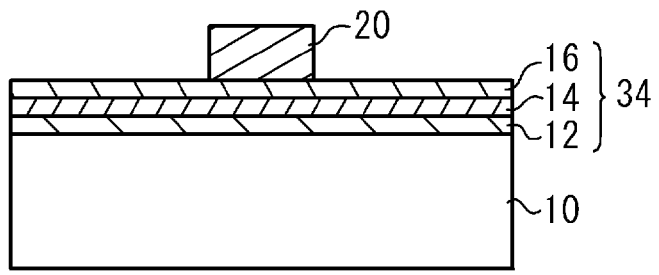
FIG. 4A through FIG. 5C illustrate a method for manufacturing the flash memory of FIG. 3, according to the first embodiment.

FIG. 4A through FIG. 5C illustrate a method for manufacturing the flash memory of FIG. 3, according to the first embodiment. In FIG. 4A, the tunnel oxide film 12 (e.g., a silicon oxide film) is formed on the semiconductor substrate 10 as a p-type silicon substrate (e.g., or the semiconductor substrate 10 with a p-type silicon region). The charge storage layer 14 (e.g., a silicon nitride film) is formed on the tunnel oxide film 12. The top oxide film 16 as a silicon oxide film is further formed on the charge storage layer 14. The tunnel oxide film 12, the charge storage layer 14 and the top oxide film 16 may be produced by a CVD method. As a result, the second insulation film 34 (e.g., an ONO film) may be formed by layering the tunnel oxide film 12, the charge storage layer 14 and the top oxide film 16 on the semiconductor substrate 10. The gate electrode 20 (e.g., a polysilicon) with a predetermined shape is applied on the second insulation film 34.

Figure 4B:
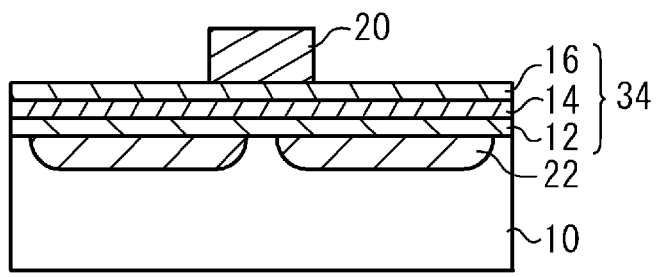

In FIG. 4B, arsenic ions are implanted to the semiconductor substrate 10, and the thermal process is performed by using the gate electrode 20 as a mask. Then, the bit lines 22 (e.g., N-type diffusion layers) are formed in the semiconductor substrate 10 to have respective adjacent side edges below the gate substrate 20.

Figure 4C:
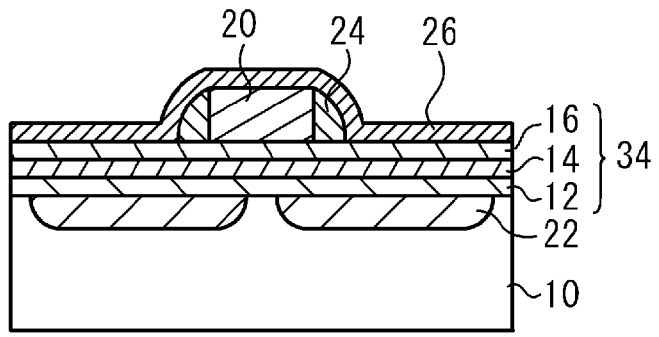

In FIG. 4C, the silicon oxide film is formed to cover the gate electrode 20, and an etching process is performed to form the side wall layers 24 (e.g., a silicon oxide film) on both sides of the gate electrode 20. The lower layer insulation film 26 (e.g., a silicon oxide film) is formed on the second insulation film 34 to cover the gate electrode 20 and the side wall layers 24. The side wall layers 24 are formed to reduce the level of the stepped portion of the gate electrode 20 such that the lower layer insulation film 26 and the first insulation film 40 which contains the silicon particles 36 easily cover the gate electrode 20.

Figure 4D:
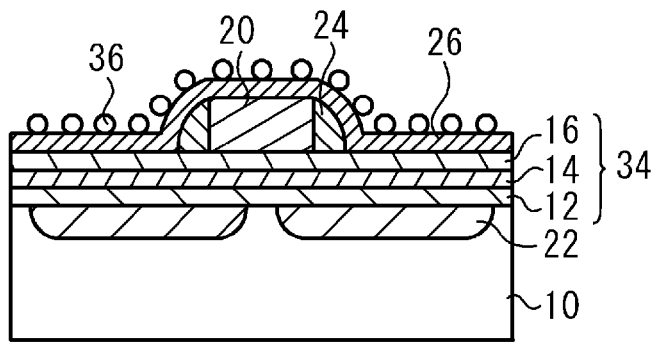
Figure 6A:
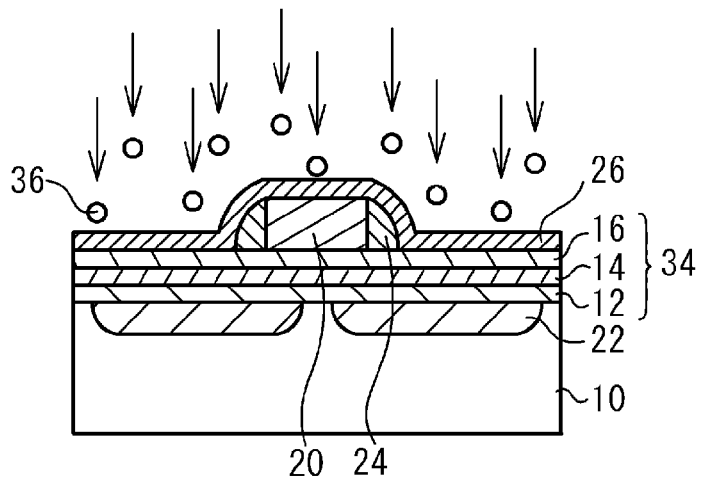
FIG. 6A illustrates an exemplary method for producing silicon particles on the lower layer insulation film of the flash memory of FIG. 3, according to the first embodiment.

In FIG. 4D, the silicon particles 36 are formed on the lower layer insulation film 26. FIG. 6A illustrates an exemplary method for producing the silicon particles 36 on the lower layer insulation film 26, according to the first embodiment. As shown in FIG. 6A, the semiconductor device 10 with the lower layer insulation film 26 as the outermost layer is disposed in an atmosphere of silane ($SiH_4$) gas where the plasma is instantaneously generated. The silane gas instantaneously reacts to produce the silicon particles 36 before it reaches the semiconductor substrate 10. The silicon particles 36 adhere to the lower layer insulation film 26, thereby forming the silicon particles 36 on the lower layer insulation film 26. The plasma may be instantaneously generated in the atmosphere of the silane gas using a plasma CVD apparatus.

Figure 6B:
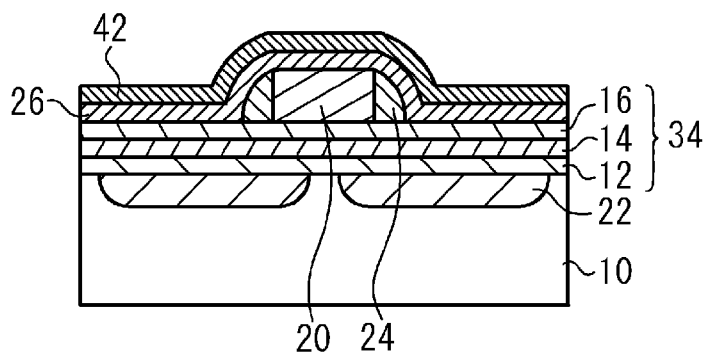
FIG. 6B and FIG. 6C illustrate another exemplary method for producing the silicon particles, according to the first embodiment.
Figure 6C:
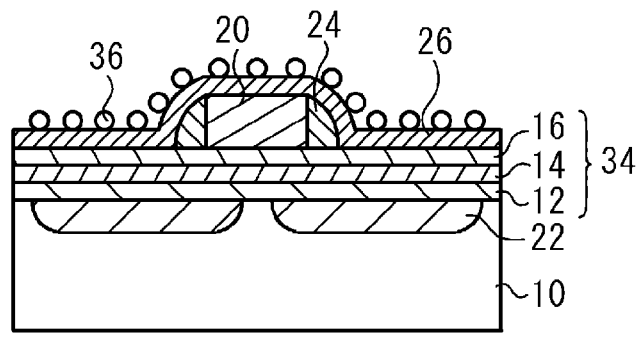

FIG. 6B and FIG. 6C illustrate another exemplary method for producing the silicon particles 36, according to the first embodiment. As shown in FIG. 6B, a silicon thin film 42 is formed on the lower layer insulation film 26 through the CVD method or a physical vapor deposition (PVD) method. As shown in FIG. 6C, the silicon thin film 42 is instantaneously heated at 1200° C., whereby the silicon thin film 42 is aggregated to form the silicon particles 36 on the lower layer insulation film 26. The instantaneous heating of the silicon thin film at 1200° C. may be performed through an RTA (Rapid Thermal Annealing) method or a laser annealing method.

Figure 5A:
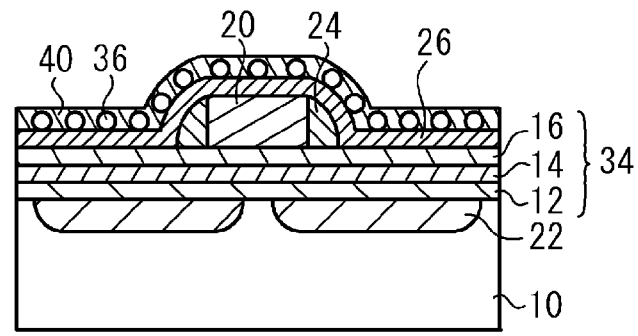
Figure 5B:
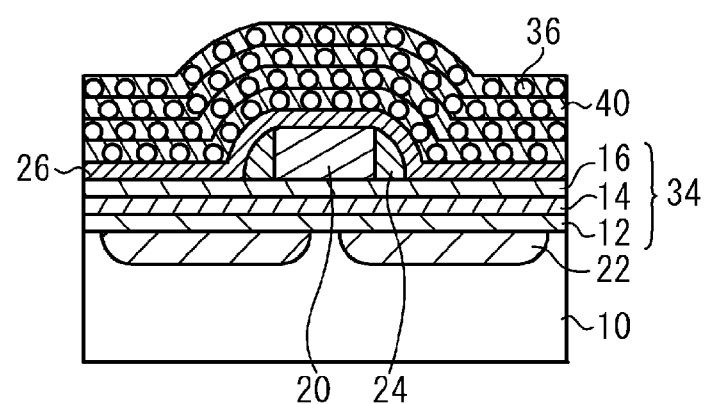
Figure 5C:
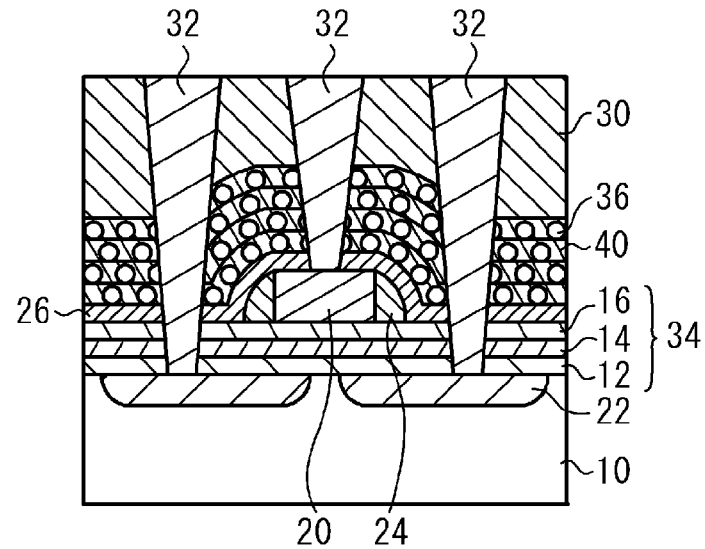

FIG. 5A through FIG. 5C illustrate formation of a plurality of UV blocking films. In FIG. 5A, the first insulation film 40 (e.g., a silicon oxide film) is formed on the lower layer insulation film 26 to cover the silicon particles 36. The first insulation film 40 may be formed using the CVD method. In FIG. 5B, the process illustrated in FIG. 5A may be repeated to form four layers of the first insulation films 40 each containing the silicon particles 36. In FIG. 5C, the upper layer insulation film 30 (e.g., a silicon oxide film) is formed on the fourth layer of the first insulation film 40. Through holes are formed above the bit lines 22 by piercing the second insulation film 34, the lower layer insulation film 26, the first insulation films 40 and the upper layer insulation film 30. Another through hole is also formed above the gate electrode 20 by piercing the lower layer insulation film 26, the first insulation films 40 and the upper layer insulation film 30. The through holes are filled with tungsten to form the plug metals 32.

In the first embodiment, the extinction coefficient of the silicon particle 36 with respect to the UV ray (wavelength: 250 nm) is 3.8 or greater. Meanwhile, the extinction coefficient of the first insulation film 40 as the silicon oxide with respect to the UV ray (wavelength 250 nm) is 0.01 or less. That is, the extinction coefficient of the silicon particle 36 with respect to the UV ray is higher than that of the silicon oxide with respect to the UV ray. Accordingly, the silicon particle 36 absorbs more UV rays compared with the silicon oxide, which includes the first insulation film 40, the lower layer insulation film 26, and the upper layer insulation film 30.

In FIG. 5C, even after the through holes are formed through the RIE method, more UV rays generated by the plasma may be absorbed by the silicon particles 36 contained in the first insulation film 40. Accordingly, the amount of the UV rays which reach the second insulation film 34 is reduced. The structure provided with the first insulation film 40 which contains the silicon particles 36 formed on the second insulation film 34 is capable of suppressing the damage of UV rays to the second insulation film 34. The use of the first insulation film 40 which contains the silicon particles 36 on the semiconductor substrate 10 suppresses the amount of the UV rays irradiated to the semiconductor substrate 10. This may prevent the increase in the threshold voltage of the ONO film due to the UV rays.

In FIG. 3, because the silicon particles 36 contained in the first insulation film 40 are not in contact with one another, the current flowing through the first insulation film 40 may be suppressed. That is, although the plug metals 32 are in contact with the first insulation film 40, a flow of leak current between the plug metals 32 can be suppressed as not all of the silicon particles 36 are in contact with one another. That is, some of the silicon particles 36 may be in contact with one another. However, the flow of leak current between the plug metals 32 can be prevented as long as there is no current path formed by the silicon particles 36 between them.

In the manufacturing method according to the first embodiment, the semiconductor substrate 10 having the lower layer insulation film 26 as the outermost layer is disposed in a silane gas atmosphere using the plasma CVD apparatus as shown in FIG. 6A. In the embodiment, the plasma CVD apparatus is used to generate the silicon particles 36. However, any method may be employed to cause the gas to react, such as the irradiation of light rays to the gas.

In FIG. 6B and FIG. 6C, the silicon thin film 42 is formed on the lower layer insulation film 26, and it is instantaneously heated to form the silicon particles 36 using the RTA method or the laser annealing method. The thin film formed of the same material as the particles contained in the first insulation film 40 is formed on the lower layer insulation film 26, which is aggregated by instantaneous heating to form the particles formed of the same material as the one for forming the thin film. In the first embodiment, the RTA method or the laser annealing method is employed, but any method may be employed so long as it allows aggregation of the silicon thin film 42 by the instantaneous heating. Especially, the laser annealing method allows aggregation of only the silicon thin film 42, by heating only the silicon thin film 42 by the use of the laser with a short wavelength.

In FIG. 5B, multiple layers of the insulation films 40 are formed, where each layer contains the silicon particles 36. Accordingly, for the UV rays to reach the semiconductor substrate 10, they have to pass through more silicon particles 36. In addition, the entire surface of the second insulation film 34 may be covered with the silicon particles 36 when viewed from above the second insulation film 34.

Figure 7A:
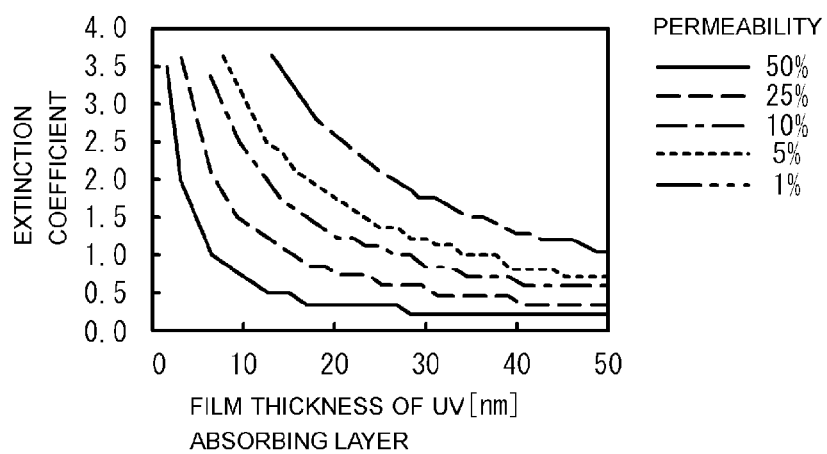
FIGS. 7A and 7B show the results of simulating the permeability with respect to the film thickness and the extinction coefficient of the UV absorbing layer in the flash memory of FIG. 3, according to the first embodiment.
Figure 7B:
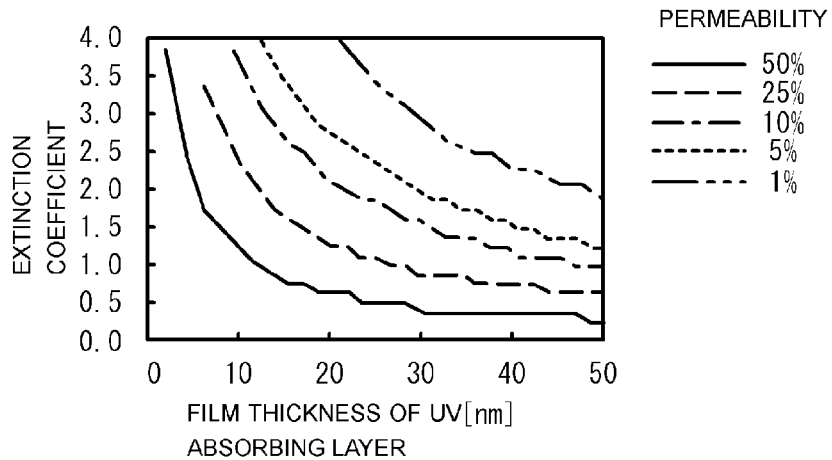
Figure 7C:
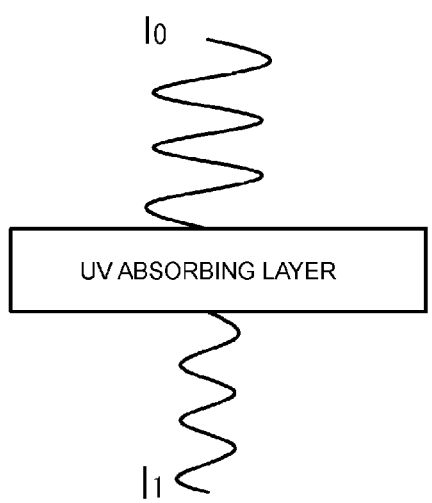
FIG. 7C illustrates UV energy entering and passing the UV absorbing layer, according to the first embodiment.

FIGS. 7A and 7B show the results of simulating the permeability with respect to the film thickness and the extinction coefficient of the UV absorbing layer, according to the first embodiment. The permeability denotes the ratio of the UV energy before entering the UV absorbing layer ($I_0$) to the UV energy after passing the UV absorbing layer ($I_1$), that is, $I_1/I_0$ (see FIG. 7C). As the permeability decreases, more UV rays are absorbed by the UV absorbing layer. FIGS. 7A and 7B show the results of the simulations using the UV rays with the wave lengths of 150 nm and 250 nm, respectively.

In FIG. 7A and FIG. 7B, assuming that the extinction coefficient is constant, the permeability becomes low as the film thickness of the UV absorbing layer is increased. In the first embodiment, the silicon particles 36 are used as the UV absorbing layer, and the first insulation films 40 each containing the silicon particles 36 are layered as shown in FIG. 3. This makes it possible to allow the UV rays to pass through more silicon particles 36 compared with the case where the first insulation films 40 each containing the silicon particle 36 are not layered. The aforementioned structure substantially increases the film thickness of the silicon particles 36. The first embodiment having the layered first insulation films 40 each containing the silicon particles 36 ensures the permeability of the UV ray to be lower compared with the case where the first insulation films each containing the silicon particles 36 are not layered. This makes it possible to further suppress the influence of the UV rays to the second insulation film 34.

In the first embodiment, the silicon particle 36 has the diameter in the range from 1 to 10 nm as shown in FIG. 3. Because the extinction coefficient of the silicon particle 36 to the UV ray with the wavelength of 250 nm is 3.8 or greater, the permeability may be in the range from approximately 10% to 50% as indicated by FIG. 7B. The film thickness and the extinction coefficient of the UV absorbing layer may be determined based on the wavelength and the permeability of the UV ray derived from the calculation results shown in FIG. 7A and FIG. 7B. Then, the film thickness of the UV absorbing layer and the material for forming the layer may be determined appropriately. That is, the first embodiment allows the diameter of the particle contained in the first insulation film 40 and the material for forming the particle to be determined appropriately.

In the first embodiment, the silicon particles 36 are employed to be contained in the first insulation film 40. However, any material may be employed so long as it exhibits an extinction coefficient higher than the extinction coefficient of the first insulation film 40 to the UV ray. In FIG. 3, four layers of the first insulation films 40 are layered. However, five or six layers of the first insulation films 40 may be employed or they do not have to be layered. Preferably, the first insulation films 40 are layered to reduce the permeability of the UV rays and to suppress the damage of the UV rays to the second insulation film 34.

Figure 8:
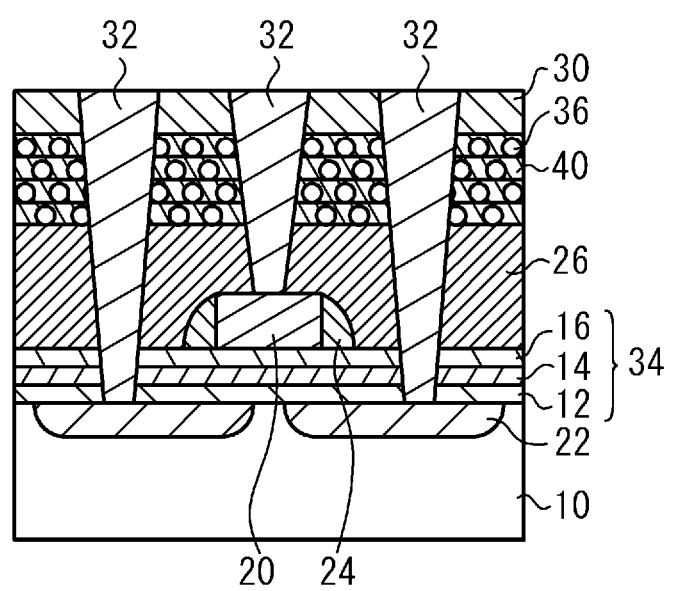
FIG. 8 is a cross sectional view of an exemplary flash memory as an alternative embodiment to the first embodiment.

FIG. 8 is a cross sectional view of an exemplary flash memory as an alternative embodiment to the first embodiment. In FIG. 8, the upper surface of the lower layer insulation film 26 formed on the second insulation film 34 to cover the gate electrode 20 is flat. Any other features are the same as those of the first embodiment as shown in FIG. 3, and explanations thereof, thus will be omitted.

The method for manufacturing the flash memory as the alternative to the first embodiment is substantially the same as that of the first embodiment except that the lower insulation film 26 is formed on the second insulation film 34 to cover the gate electrode 20 as shown in FIG. 4C, and the lower insulation film 26 has its upper surface flat. This makes it possible to easily form the silicon particles 36 and the first insulation film 40 to cover the silicon particles 36. The manufacturing processes are similar to those of the first embodiment as shown in FIG. 4A to FIG. 5C, and explanations thereof, thus will be omitted.

Second Embodiment

Figure 9:
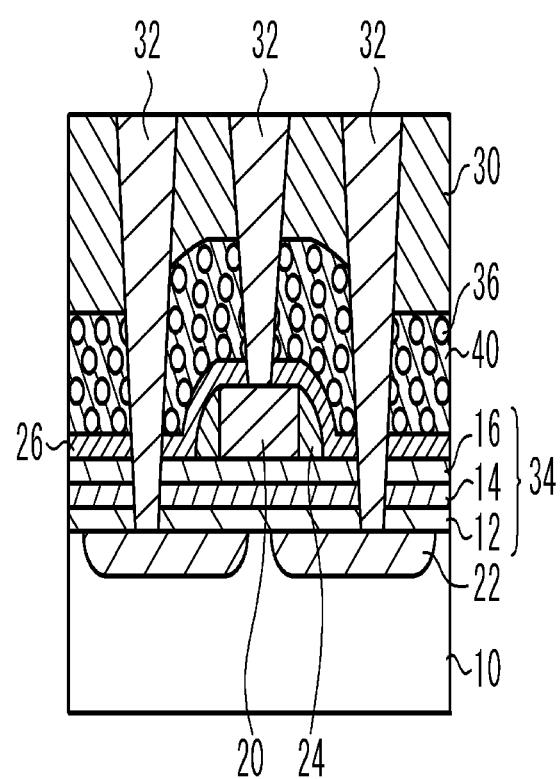
FIG. 9 is a cross sectional view of an exemplary flash memory, according to a second embodiment.

FIG. 9 is a cross sectional view of an exemplary flash memory, according to a second embodiment. In FIG. 9, a single layer of the first insulation film 40 is formed on the lower layer insulation film 26. The silicon particles 36 contained in the first insulation film 40 are dispersed in both the widthwise and lengthwise directions. In one exemplary implementation, the first insulation film 40 formed of the BPSG (Boron-Phosphorous Silicate Glass) film has a thickness of 15 nm. Other features are similar to those in the first embodiment as shown in FIG. 3, and explanations thereof are omitted.

FIG. 10A through FIG. 10D illustrate an exemplary method for manufacturing the flash memory of FIG. 9, according to the second embodiment. Particularly, FIG. 10A through 10D illustrate formation of a single layer UV blocking layer. The process steps for forming the second insulation film 34 as the ONO film on the semiconductor substrate 10, forming the gate electrode 20 on the second insulation film 34, forming the side wall layers 24 on both side surfaces of the gate electrode 20, forming the bit lines 22 in the semiconductor substrate 10, and forming the lower layer insulation film 26 on the second insulation film 34 to cover the gate electrode 20 are similar to those described in the first embodiment as shown in FIGS. 4A to 4C, and explanations thereof are omitted.

Figure 10A:
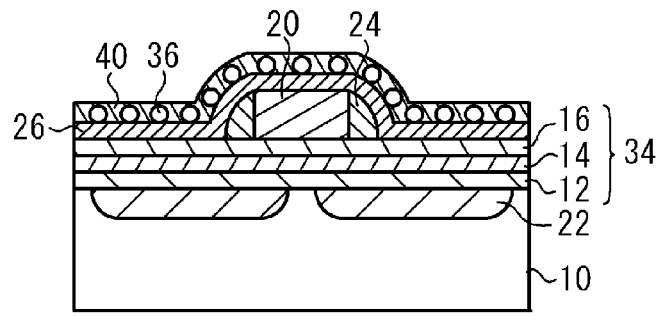
FIG. 10A through FIG. 10D illustrate an exemplary method for manufacturing the flash memory of FIG. 9, according to the second embodiment.
Figure 10B:
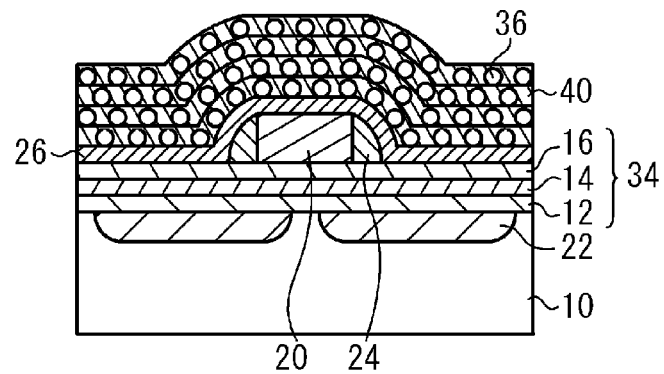
Figure 10C:
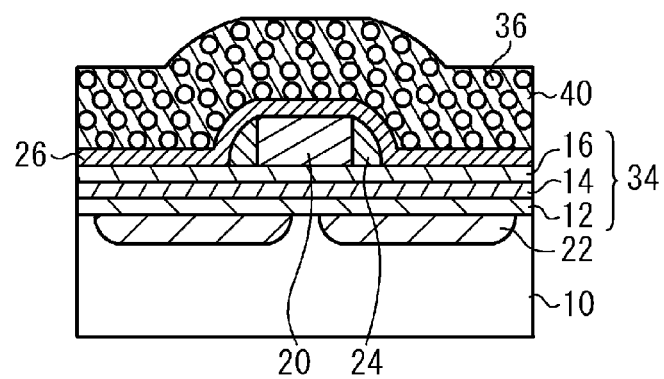

In FIG. 10A, the silicon particles 36 are formed on the lower layer insulation film 26. Then, the first insulation film 40 that is formed of the BPSG film through, for example, the CVD method is applied to cover the silicon particles 36. The process is repeatedly performed to layer four first insulation films 40 each containing the silicon particles 36, as illustrated in FIG. 10B. In FIG. 10C, the respective first insulation films 40 are brought into a molten state. The four layers of the first insulation films 40 are formed into a single layer of the first insulation film 40 having the silicon particles 36 dispersed in both the widthwise and lengthwise directions. The BPSG film with the low softening temperature is employed for forming the first insulation film 40 so as to be easily melted.

Figure 10D:
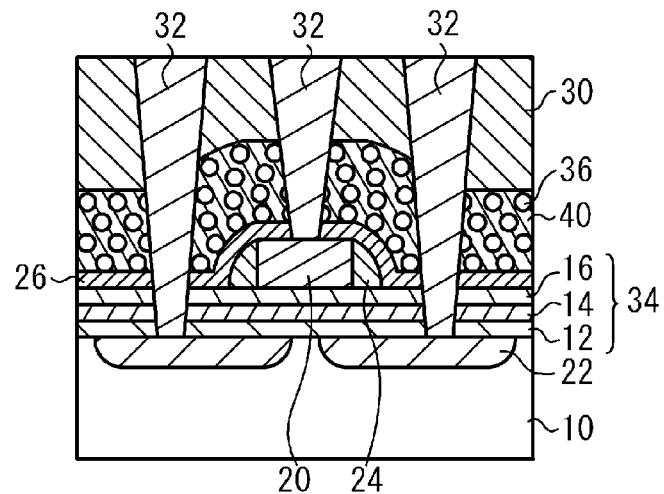

In FIG. 10D, the upper layer insulation film 30 formed of a silicon oxide film is applied onto the first insulation film 40. The plug metals 32 are formed above the bit lien 22 by piercing the second insulation film 34, the lower layer insulation film 26, the first insulation film 40 and the upper layer insulation film 30. Another plug metal 32 is also formed above the gate electrode 20 by piercing the lower layer insulation film 26, the first insulation film 40 and the upper layer insulation film 30. The plug metal 32 may be formed of tungsten in one exemplary embodiment.

The single layer of the first insulation film 40 having the silicon particles 36 dispersed in the widthwise and lengthwise directions can reduce the permeability of UV rays irradiated to the first insulation film 40. This makes it possible to further suppress the damage of the UV rays to the second insulation film 34, thus reducing the damage to the second insulation film 34 by the UV rays.

In FIG. 9, the single layer of the first insulation film 40 is formed on the lower layer insulation film 26. Since the layered first insulation films 40 are respectively melted to form the single layer, no interface is formed between the first insulation films 40. Accordingly, the insulation property between the plug metals 32 can be improved.

Although the first insulation film 40 is formed of the BPSG film as shown in FIG. 9, it may be formed of a silicon oxide film or an insulation film such as a phosphorous silicate glass (PSG) film and a boron silicate glass (BSG) film. It is preferable to employ the insulation film having a low softening temperature since the first insulation film 40 needs to be melted. In addition, the thickness of the first insulation film 40 can be set to 15 nm or thicker to have more silicon particles 36 in the first insulation film 40 for reducing the damage of the UV rays to the second insulation film 34. Furthermore, two or more layers of the first insulation films 40 may be employed to further reduce the damage done by the UV rays to the second insulation film 34.

In an alternative embodiment, a semiconductor device of the invention is not limited to this. For example, the semiconductor device with a MOSFET type structure may be produced where a silicon oxide film is formed on the semiconductor substrate 10, the gate electrode 20 is formed on the silicon oxide film, the first insulation film 40 which contains the silicon particles 36 is formed on the silicon oxide film and the gate electrode 20, and the source region and the drain region are formed in the semiconductor substrate 10 to have the respective adjacent side edges below the gate electrode 20.

The first insulation film 40 which contains the silicon particles 36 is formed on the gate oxide film, and the amount of the UV rays to reach the gate oxide film is thereby reduced, thus reducing the damage of the UV rays to the gate oxide film as well as reduction in the voltage resistance of the gate oxide film. In the case where a CCD (Charge Coupled Device) transistor is produced, the oxide film as a silicon oxide film is formed between the semiconductor substrate and the electrode. In the invention, the use of the first insulation film 40 which contains the silicon particles 36 on the oxide film suppresses the damage of the UV rays to the oxide film. This makes it possible to decrease the noise due to the UV ray damage.

The use of the first insulation film 40 which contains the silicon particles 36 on the semiconductor substrate 10 can suppress the damage to the insulation film on the semiconductor substrate 10, irrespective of execution of the step for generating UV rays after forming the first insulation film 40. Because silicon oxide and silicon nitride are likely to cause a failure by UV rays, the use of the insulation film which contains at least one of silicon oxide and silicon nitride may provide further improved effect of the invention. In the case where the semiconductor device such as the transistor formed on the semiconductor substrate 10 is not provided with the insulation film, the semiconductor device may be damaged by UV rays. The use of the first insulation film 40 which contains the silicon particles 36 on the semiconductor substrate 10 may suppress the damage to the semiconductor device formed on the semiconductor substrate 10.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A semiconductor device comprising:
   an oxide-nitride-oxide (ONO) film formed on a semiconductor substrate;
   a gate electrode formed on the ONO film;
   a lower layer insulation film formed on the ONO film and the gate electrode; and
   an ultraviolet (UV) blocking layer comprising
      a plurality of granular particles scattered in one or more insulation films formed on the lower layer insulation film,
         wherein each particle of the plurality of granular particles has a first extinction coefficient,
         wherein each insulation film of the one or more insulation films has a second extinction coefficient,
         wherein the first extinction coefficient of a first particle is higher than the second extinction coefficient of a first insulation film corresponding to the first particle,
         wherein at least one of the one or more insulation films comprises Boron-Phosphorous Silicate Glass (BPSG), and
   a plurality of stacked curved portions physically separated by a plurality of metal plugs above the lower layer insulation film and the ONO film,
      wherein at least a first metal plug of the plurality of metal plugs contacts the semiconductor substrate.

2. The semiconductor device according to claim 1, further comprising an upper layer insulation film deposited on the UV blocking layer.

3. The semiconductor device according to claim 2, further comprising a plurality of bitlines formed in the semiconductor substrate and below the ONO film.

4. The semiconductor device according to claim 3, further comprising at least a second metal plug of the plurality of metal plugs coupled to the gate electrode or at least one of the plurality of bitlines,
   wherein the at least a second metal plug is formed above and connects to the gate electrode by piercing through the upper layer insulation film, the UV blocking layer, and the lower layer insulation film, and
   wherein the at least a second metal plug is formed above and connects to the at least one of the plurality of bitlines by piercing through the upper layer insulation film, the UV blocking layer, the lower layer insulation film, and the ONO film.

5. The semiconductor device according to claim 4,
   wherein the one or more insulation films comprise a plurality of layered insulation films, and
   wherein the plurality of granular particles comprises a plurality of silicon particles.

6. The semiconductor device according to claim 5, wherein each of the plurality of layered insulation films is approximately 10 nm in thickness.

7. The semiconductor device according to claim 5, wherein the plurality of silicon particles are scattered in a lengthwise direction in the each of the plurality of layered insulation films.

8. The semiconductor device according to claim 4, wherein the one or more insulation films comprise a single layer insulation film, and
   wherein the single layer insulation film comprises a plurality of silicon particles.

9. The semiconductor device according to claim 8, wherein the plurality of silicon particles are scattered in the single layer insulation film in a lengthwise direction and in a widthwise direction.

10. The semiconductor device according to claim 9, wherein the single layer insulation film is approximately 15 nm in thickness.

11. The semiconductor device according to claim 4, wherein the one or more insulation films comprise a single layer insulation film.

12. The semiconductor device according to claim 1, wherein the each particle of the plurality of granular particles measures about 1 nm to about 10 nm in diameter.

13. The semiconductor device according to claim 4, wherein the each particle of the plurality of granular particles is not in contact with any other of the plurality of granular particles.

14. The semiconductor device according to claim 4,
   wherein at least one particle of the plurality of granular particles is not in contact with any other particle of the plurality of granular particles, and
   wherein not all of the plurality of granular particles are separated from the others.

15. The semiconductor device according to claim 5, wherein the plurality of layered insulation films comprises four layered insulation films.

16. The semiconductor device according to claim 5, wherein the plurality of layered insulation films comprises five or six layered insulation films.

17. The semiconductor device according to claim 1, wherein the lower layer insulation film formed on the ONO film and the gate electrode comprises an upper surface that is flat.

18. The semiconductor device according to claim 4, wherein at least one of the plurality of metal plugs comprises tungsten.

* * * * *